(12) United States Patent
Christou (10) Patent No.: US 6,992,246 B2
(45) Date of Patent: Jan. 31, 2006

(54) JAMB-MOUNTED SEAL FOR AN EMI SHIELDED ROOM

(75) Inventor: Christakis Christou, Glendale Heights, IL (US)

(73) Assignee: Lindgren RF Enclosures, Inc., Glendale Heights, IL (US)

(*) Notice: Subject to any disclaimer, the term of this patent is extended or adjusted under 35 U.S.C. 154(b) by 72 days.

(21) Appl. No.: 10/684,165

(22) Filed: Oct. 9, 2003

(65) Prior Publication Data

US 2004/0129438 A1 Jul. 8, 2004

Related U.S. Application Data

(60) Provisional application No. 60/417,615, filed on Oct. 10, 2002.

(51) Int. Cl.
*H05K 9/00* (2006.01)

(52) U.S. Cl. .............................. 174/35 GC; 174/35 MS (58) Field of Classification Search ............ 174/35 GC, 174/35 R, 35 MS; 361/816, 818
See application file for complete search history.

(56) References Cited

U.S. PATENT DOCUMENTS

| 4,371,175 A | * | 2/1983 | Van Dyk, Jr. .......... 174/35 GC |
| 4,746,765 A | * | 5/1988 | Mallott .................. 174/35 GC |
| 4,953,324 A | * | 9/1990 | Herrmann ..................... 49/255 |

* cited by examiner

*Primary Examiner*—Hung V. Ngo
(74) *Attorney, Agent, or Firm*—Cherskov & Flaynik

(57) ABSTRACT

A door jamb assembly for an EMI shielded room with the room having an electrically conductive room shield, an electrically conductive door, the jamb comprising electrically conductive members electrically connected to the room shield and biased to the confines of the door jamb; and a means for extending the conductive members outwardly from the door jamb so as to establish electrical contact with the door.

10 Claims, 8 Drawing Sheets

FIG. 8

JAMB-MOUNTED SEAL FOR AN EMI SHIELDED ROOM

This application claims the benefit of prov. application 60/417,615 filed on Oct. 10, 2002.

BACKGROUND OF THE INVENTION

1. Field of the Invention

The present invention relates to electromagnetic interference (EMI) shielding and more particularly, to a door assembly for an EMI shielded room.

2. Background of the Invention

Shielded rooms are used to prevent egress and ingress of electromagnetic radiation. The radiation in question may be ambient radiation generated from outside activities or radiation generated inside the room and which must be confined therein.

The shielded room typically comprises walls, ceiling, and floors covered with one or more layers of electrically conductive metal sheets, meshing, or screening. An electrically conductive door is often provided so that personnel may enter and leave the room. When the door is closed, the gap between the door leaf and the jamb must be shielded from electromagnetic radiation encroachment and the shield on the door leaf must be continuously and intimately connected to the room shielding along the entire periphery of the door where the door opposes the jamb.

One approach has been to use resilient contact fingers along the edges of the door (see U.S. Pat. No. 4,786,758). A disadvantage in this design is the force exerted on the resilient fingers when the door is opened or closed, said force often leading to breakage or deformation of the fingers.

Other invented devices feature bladders mounted on the door leaf which facilitate the outward extension of the shield substrate from the interior of the door (see U.S. Pat. Nos. 5,786,547 and 5,569,878). While elegant in design, these bladder configurations result in a bulky and expensive door leaf having a substantial number of moving parts.

Generally, inclusion of moving parts, bladders, tubing and other intricate items within the confines of a door tend to make the door less tolerant to shock and heat.

A need exists in the art for an EMI enclosure door leaf having no moving parts except for its handle and transport mechanisms such as the hinges or hangers. The door should be capable of attenuating electromagnetic radiation up to 100 dB. Also the door should be capable of withstanding temperatures of up to 927° C. (1700° F.) for approximately 90 minutes.

SUMMARY OF THE INVENTION

It is an object of the present invention to provide a device to impart electromagnetic radiation shielding for a door to a shielded room that overcomes many of the disadvantages of the prior art.

Another object of the present invention is to provide an electromagnetic radiation shielded door leaf having no moving parts. A feature of the present invention that all the shielding engaging apparatuses are mounted on the door frame so as to contact the entire periphery of the door when the door is closed. An advantage of the present invention is that it results in a low weight streamlined door leaf that is adapted to receive fire-retarding materials. Another advantage of the present invention is that it results in a comparatively low torque being exerted on the door hinges.

Yet another object of the present invention is to provide an ingress/egress closure means for an EMI shielded room. A feature of the present invention that all active EMI shielding apparatuses are mounted interior to and flush with the door jamb. An advantage of the present invention is the provision of smooth door jamb- and threshold surfaces.

Still another object of the present invention is to provide a door jamb containing active EMI shielding substrates that is adapted to receive a shielding-clad door. A feature of the present invention is that the door jamb contains a plurality of electrically conducting substrates activated by electronically-controlled air pressure. Another feature is that the substrates default to a position flush with the jamb surface when air pressure is not applied. An advantage of the present invention is that in the event of a power failure or a mechanical failure, the substrates are spring-biased to an open position, enabling door actuation for egress and ingress.

Briefly, the invention provides a means of ingress and egress into an EMI shielded room, the means comprising a door leaf defining an inner space adapted to receive heat-resisting materials, a conductive contact area along the door's edges, a doorway bounded by a jamb, a flexible electrically conductive retractable shield attached to the jamb and electrically connected to the shielded room, one or more pressurized fluids to act upon the retractable shield in a way that the retractable shield establishes electrical communication with the contact area, means for supplying said gas upon receipt of an electrical signal, and means to automatically retract said shield upon cessation of said signal so as to disengage said shield from said contact area. The shield may comprise one or more conductive fingers or bladders adapted to be engaged with the door edge contact area upon receipt of the electric signal.

Also provided is a modular assembly for preventing electromagnetic radiation from leaking between a door leaf and a door jamb of a shielded room, the assembly comprising an elongated frame adapted to be attached along a peripheral edge of the door leaf; an elongated, electrically conductive webbing in slidable communication with said frame; a means for extending the webbing from the edge; and a means for retracting the webbing to a position which is in close spatial relation to the frame.

BRIEF DESCRIPTION OF THE DRAWINGS

The foregoing invention and its advantages may be readily appreciated from the following detailed description of the invention, when read in conjunction with the accompanying drawing in which:

FIG. 2 is a cross-sectional view of a door and deployed doorway assembly for an EMI shielded room, in accordance with features of the present invention;

DETAILED DESCRIPTION OF THE INVENTION

The present invention provides a door jamb containing active EMF shielding apparatuses. The jamb is adapted to receive a door, which by itself contains no moving parts but for its handle and a hinging means for facilitating door opening and closure. The jamb contains one or more flexible electrically conductive members in electrical communication with an EMF-shielded room. A remotely activated electrical signal causes the members to extend outwardly from the jamb so as to make electrical contact with a door received by the jamb.

Figure 1:
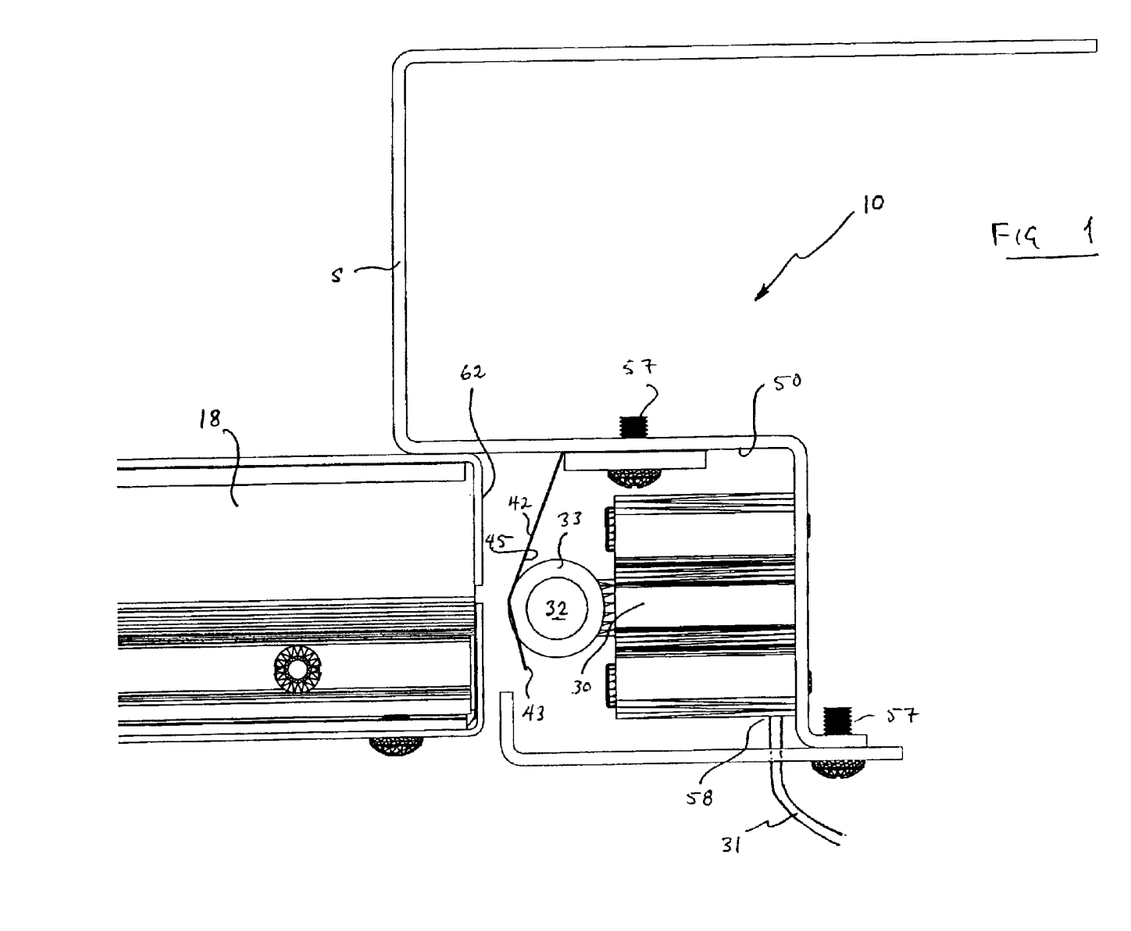
FIG. 1 is a cross-sectional view of a door and a retracted doorway assembly for an EMI shielded room, in accordance with features of the present invention.

In FIG. 1, numeral 10 depicts a means for regulating ingress and egress to and from an EMF shielded enclosure. The means comprises a specially designed door jamb 14 adapted to receive a door leaf 18. An interior service of the door jamb defines a cavity 22 which extends longitudinally along the jamb. The cavity houses and substantially encases a contact actuator assembly 26, the assembly comprising one or more outwardly directed pistons 30. The door jamb cavity 22 is the result of extension of an electrical shield "S" overlaying the exterior of the room.

Contact Actuator Detail

FIG. 1 depicts the jamb configuration in an "open" condition, i.e. when a jamb conductive shield is not engaged with the door leaf. An outwardly facing end 25 of the pistons support a longitudinally extending rod 32, whereby the rod extends in a direction perpendicular to the direction the pistons extend. An electrically conductive webbing or sheet 42 also extends longitudinally so as to extend in a direction perpendicular to the direction the pistons extend. A first end 43 of the webbing is spring biased against the rod, but not permanently attached thereto. A second end 39 of the webbing is attached to the electrical shield of the room.

When the pistons 30 are activated, via the application of pressurized fluid from a supply line 31, the webbing 42 extends outwardly until electrical contact is established between the webbing 42 and an electrically conductive region 62 of the door leaf 18. As shown in FIG. 1, the electrically conductive region 62 generally extends at right angles from the plane of the door leaf so as to define a periphery of the door leaf. A surface of the electrically conductive region 62 faces outwardly in a direction that is generally parallel with the plane of the door leaf so as to mate with the outwardly directed surface of the webbing 42.

FIGS. 1 and 2 depict the actuating rod encased in a reversibly deformable substrate 33. The substrate 33 provides a sturdy foundation for the conductive webbing when the webbing contacts the electrically conductive region 62 of the door leaf, so as to assure more complete contact (i.e. a means to minimize gaps) between the webbing 42 and the conductive region. FIG. 2 depicts deformation of the deformable substrate 33 when same is pressed against the inwardly directed surface of the webbing.

It is not necessary for the electrically conductive region 62 to be absolutely parallel with the plane defining the door jamb. Rather, and as depicted in FIG. 2, the electrically conductive region 62 of the leaf 18 and the webbing 42 need only be complementary in topography so as to assure an even, unbroken continuous contact between the webbing 42 and the electrically-conductive region 62.

The second edge 39 of the webbing 42 terminates at a longitudinally extending attachment point along an interior surface 50 of the room shield. Generally, this interior surface faces in a direction that is perpendicular to the direction in which the pistons extend. As such, a region of the webbing defines a fold 46 extending longitudinally along the webbing and generally parallel to the contact surface 62 of the door leaf 18. The fold 46 serves as a pivot point about which the first edge of the webbing 43 rotates vis-a-vis the second edge of the webbing 39.

Figure 5:
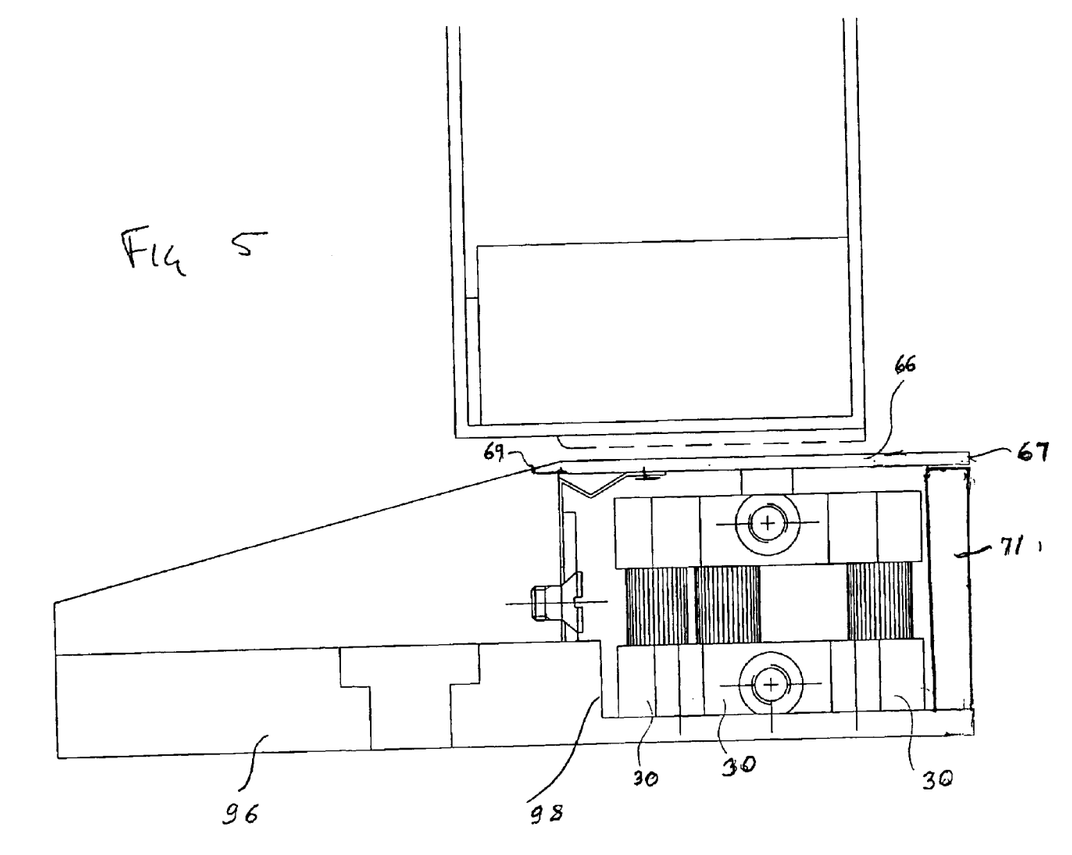
FIG. 5 is a cross-sectional view of a door and a doorway-threshold assembly for an EMI shielded room, in accordance with features of the present invention.

As depicted in FIG. 5, the actuating rod 32 is firmly attached to the piston end 25. The embodiment shown in FIG. 5 for only one of several piston assembles, affects this attachment via a pair of bushings. A reducing bushing 41 received by the piston end 25, is threadably received by the piston along the longitudinal axis of the piston 25. This reducing bushing 41 in turn receives a first end 49 of second reducing bushing 45. A second end 51 of the second reducing bushing mates with a portion of the rod 32 forming a threaded aperture 47. The first reducing bushing 41, the second reducing bushing, and the rod 32 situated intermediate the two bushings, are combined so as to present a smooth surface 53 of the rod. As such, the second reducing bushing 45 is installed into the rod 32 so that the second end 51 of the second reducing bushing 45 is flush with the rod surface 53, or slightly countersunk relative thereto.

It is noteworthy that the cylinder module depicted in FIG. 5 enables the user to adapt any door to the jamb-actuating device described herein. As such, suitable fasteners 57 are used to attach the module at various fastener engagement points 55 on the module and complementary points along various regions of a target door. Generally, the vehicle of th preassembled module is an elongated frame 49 configured to at least partially contain th contact actuating mechanism, including the piston configuration, pressurized fluid lines, the actuating rod or bladder, and the webbing.

Cylinder Operation Detail

Figure 3:
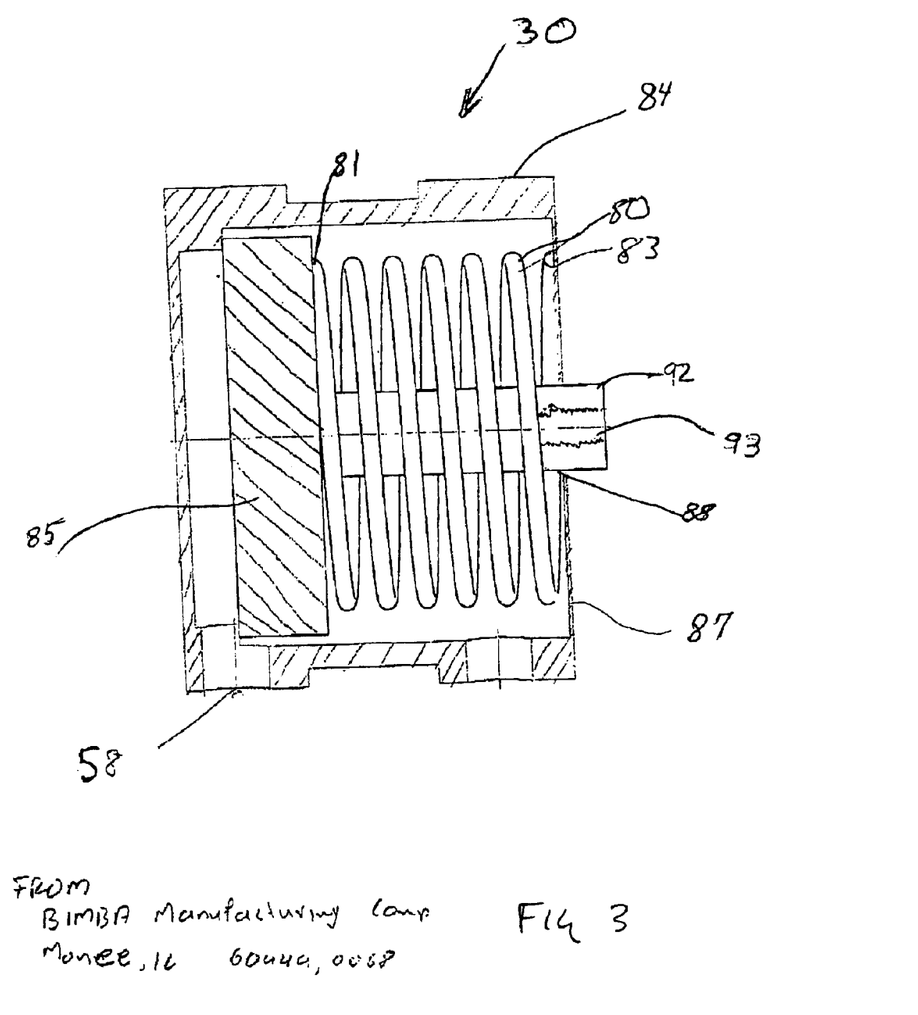
FIG. 3 is a detailed cross-sectional schematic view of a piston for a door and doorway assembly for an EMI shielded room, in accordance with features of the present invention.

FIG. 3 is a detailed cross-sectional schematic view of a double-acting cylinder 30 used to extend the electrically conducting substrate 42 outwardly from the jamb to make door contact. Such cylinders are manufactured by the BIMBA Manufacturing Co. of Monee, Ill. Generally, the cylinder assembly 30 comprises a cylindrical wall 84, a piston shaft 88, and a piston head 25. As noted supra, the piston head 25 indirectly applies an outwardly directed force against the substrate 42 via the intermediately positioned rod 32.

Housed within the cylinder, and intermediate a distal end 89 and a proximal end 87 of the cylinder 30 is situated a spring 80 so that the spring is residing in a spring compartment 82. The spring may be positioned coaxially with the piston shaft 88 if one piston is utilized. Alternatively, there may be several springs each coaxial to respective pistons if a plurality of pistons are utilized.

A first end 81 of the spring is attached to the proximal end 87 of the piston shaft 88. The second end 83 of the spring is attached to an inside surface of the distal end 89 of the cylinder. The spring 80 biases the shaft 88 inwardly (away from the door leaf) so as to substantially confine the piston within the cylinder when no pressurized fluid is supplied. When pressurized fluid is supplied to the cylinder, the piston is longitudinally extended outward from the front or distal end 89 of the cylinder. When the supply of pressurized gas ceases, the spring 80 again retracts the piston shaft 88 back into the cylinder cavity.

The piston is actuated upon by compressed fluid via a fluid means of ingress 58 positioned intermediate the proximal end 91 of the cylinder and the proximal end 87 of the piston. The proximal end 87 of the piston shaft 88 may terminate in a flared piston base or surface 95 so as to increase the surface area with which injected gas entering the cylinder may contact. To facilitate faster retraction, a second means of gas ingress 59 is provided so as to inject compressed fluid within the spring compartment 82 and at a point distal from the point 58 where pressurized fluid initially enters the cylinder to extend the cylinder outwardly. As such, the flared piston base 95 resides and slides along a region which is intermediate the first means of gas ingress 58 and second means of gas ingress 59. It should be noted that either or both the first or second ingress means can serve as a fluid egress point as well to facilitate evacuation of fluid from the cylinder during piston retraction. The egress function is facilitated by valves (no shown) situated along the supply lines 31.

The supply of pressurized gas to the pistons may be controlled by a variety of means. Specifically, it is expected that appropriate sensors would be placed on the door handles and elsewhere so as to interrupt the supply of pressurized gas if these sensors are actuated. The signals from these sensors are processed by a conventional control circuit that controls supply of the gas to the cylinders or evacuation of the cylinders by means of a bleeder valve. Any pressure empirically determined to establish intimate electrical contact between the door and the jamb is suitable. Generally, pressures anywhere above 50 pounds per square inch (psi) are suitable, and preferably above 60 psi.

The spring bias feature of the instant electrical-contact actuating configuration is such that positive pressure is required to establish and maintain physical contact between the conductive webbing 42 and the door leaf.

As shown in FIG. 5, the invention also provides a door threshold contact configuration. While reminiscent of the jamb-wall and jamb-ceiling configuration depicted in FIG. 1, the threshold configuration also includes a thicker gauge contact substrate 66.

A ramp 97 leads to and away from the threshold 98. A first end 67 of the thicker contact 66 is cantilevered over the spring cylinders 30 and supported so that the outwardly or upwardly facing surface of the contact conforms to the topography desired of the threshold. An upwardly extending support substrate 71 is provided as underlayment for the first end 67 of the contact 66. In an alternative embodiment, the cylinders used to actuate the contact substrate within the threshold mechanism may be replaced by a bladder.

A second end 69 of the contact substrate 66 is attached to the threshold in a spring-biased fashion so that the first end 67 of the contact substrate 66 remains in contact with its support substrate 71 when the pistons are depowered. In summary, the contact substrate 66 remains continuous with the floor 96 of the shielded room while the pistons are embedded in the floor at the threshold 98, in depowered mode.

Figure 4:
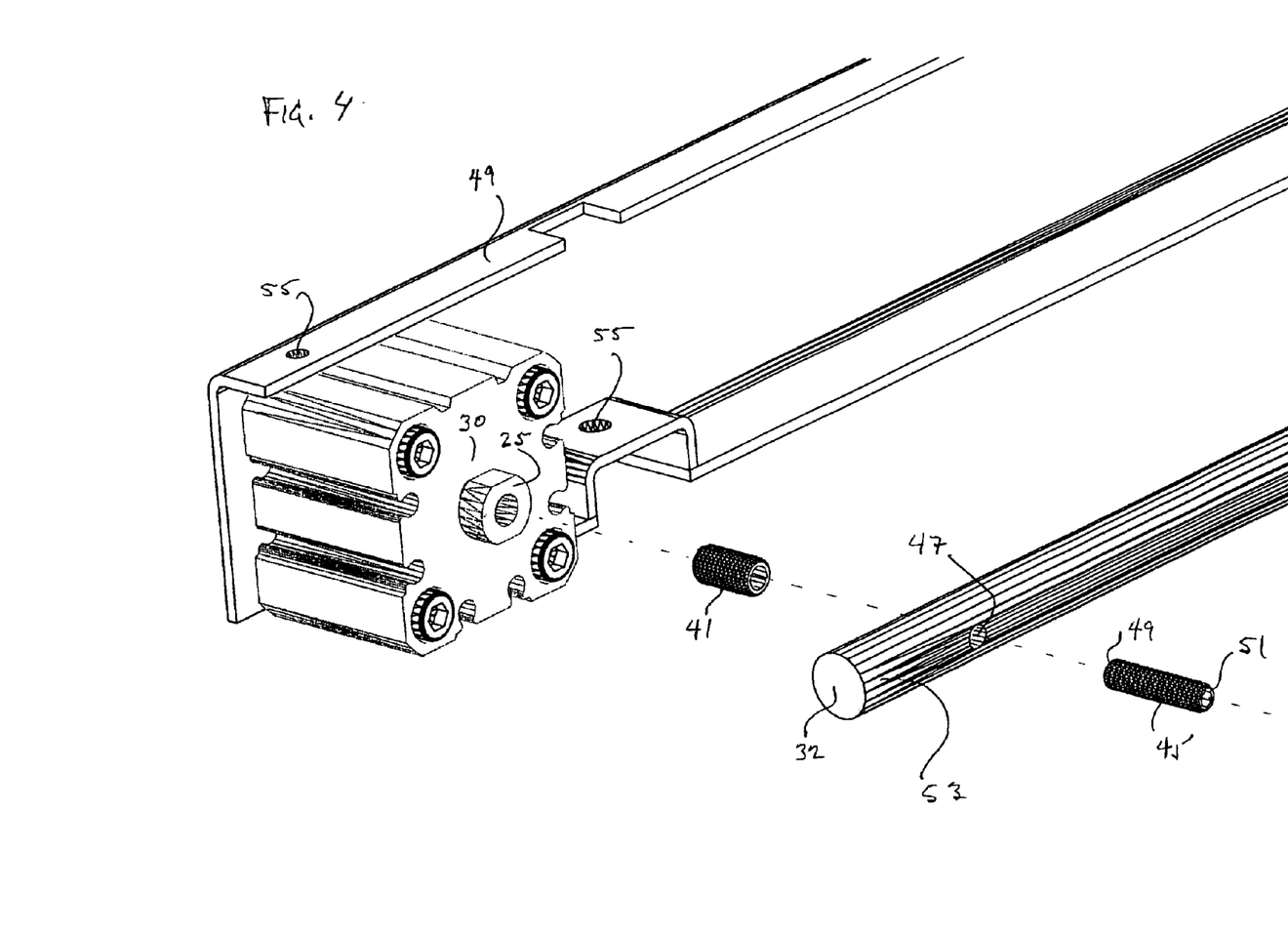
FIG. 4 is an exploded view of a means for attaching a contact actuating rod to a piston, in accordance with features of the present invention.
Figure 6:
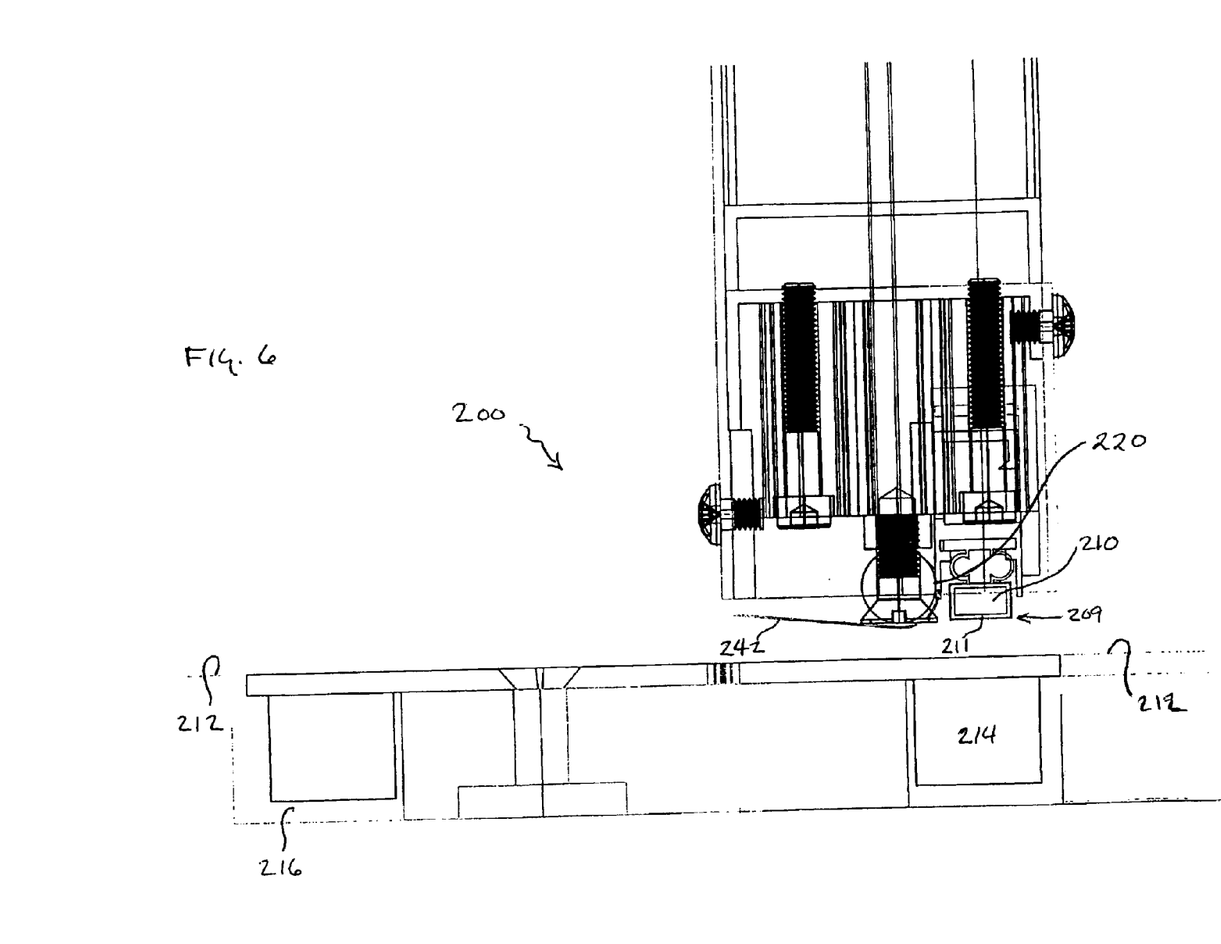
FIG. 6 is a cross-sectional view of an alternate door and doorway-threshold assembly, in accordance with features of the present invention.

FIG. 6 depicts an alternate door threshold shielding configuration, designated as numeral 200. This contact configuration differs from the jamb-wall and jamb-ceiling configurations in that the pistons and contact actuating mechanism is mounted to the bottom periphery of the door, and not the jamb. In summary, the invention provides a modular assembly for preventing electromagnetic radiation from leaking between a door leaf and a door jamb of a shielded room. This mounting paradigm confers modularity to the invented device (as noted supra in discussion related to FIG. 4), whereby standard doors can be enabled with mounting of the device onto the peripheries of the door leaf.

In this configuration, a perimeter seal 209 is provided so as to move in tandem with the contact 242. The seal serves as a sound attenuation means. The seal comprises a magnet core 210 wrapped in a reversibly deformable material 211 such as rubber, silicone, neoprene. The magnet serves to ensure tight contact between the pliable material, and a ferrous-based threshold.

Alternatively, the seal can comprise a more typical perimeter seal, such as those utilized to seal refrigerators and freezers, for example from National Guard Products, Inc. (Memphis, Tenn.).

In tandem movement of the perimeter seal with the outwardly extending contact 242 is effected via a simple point of attachment 220 of the perimeter seal to a point on the surface of the rod which will not hinder interaction of the rod with the contact. This attachment point 220 can be effected via a tack weld or via a male-female threaded configuration.

Operation Detail

FIG. 1 depicts the device in relaxed (undeployed) configuration. The pistons are actuated when pressurized gas impacts against a proximally-facing surface of the fluid-impermeable piston base. The pistons 30 then actuate the conductive webbing 42 outward from the door jamb so to establish intimate electrical contact with the electrically conductive contact area 62 on the door leaf 18. (In the case of the door threshold, and as discussed supra, the webbing extends out from the depending surface of the door leaf periphery.) The fully deployed configuration of the webbing is depicted in FIG. 2.

When pressure is relieved, the pistons default to a retracted position as depicted in FIG. 1. The cylinders 30 contain resilient springs 80 (see FIG. 2) that are extended from their equilibrium position when pressurized gas is supplied to the pistons but that retract back to the equilibrium position when the supply of the pressurized gas is interrupted. As the springs 80 retract, the cylinders 30 revert to their unextended position, disengaging the webbing 42 from electrical contact with the door edge 62. Supplying pressurized fluid to distally facing surface of the fluid impermeable piston base, particularly when actuating the door handle of a closed door leaf, assures quick release of the contact from its deployed position.

Relegating all active shielding components to the door jamb, or to bolt-on modular components to standard doors, confers many benefits to the instant design. For example, the modular feature allows the door leaf to maintain its integrity as a rigid casing. As such, flame retarding material (such as mineral wool) may be confined within the confines of the door leaf. Alternatively, the door leaf interior can be filled with a plurality of honey-comb type substrates, such as cardboard, so as to assure that the leaf does not warp during exposure to heat from fire. Lastly, the provision of a an EMI shielded window also is facilitated.

Generally, the "static" door leaf is much lighter and less bulky than other presently available EMI shielding doors, thereby rendering it more manageable with less physical effort.

Figure 7:
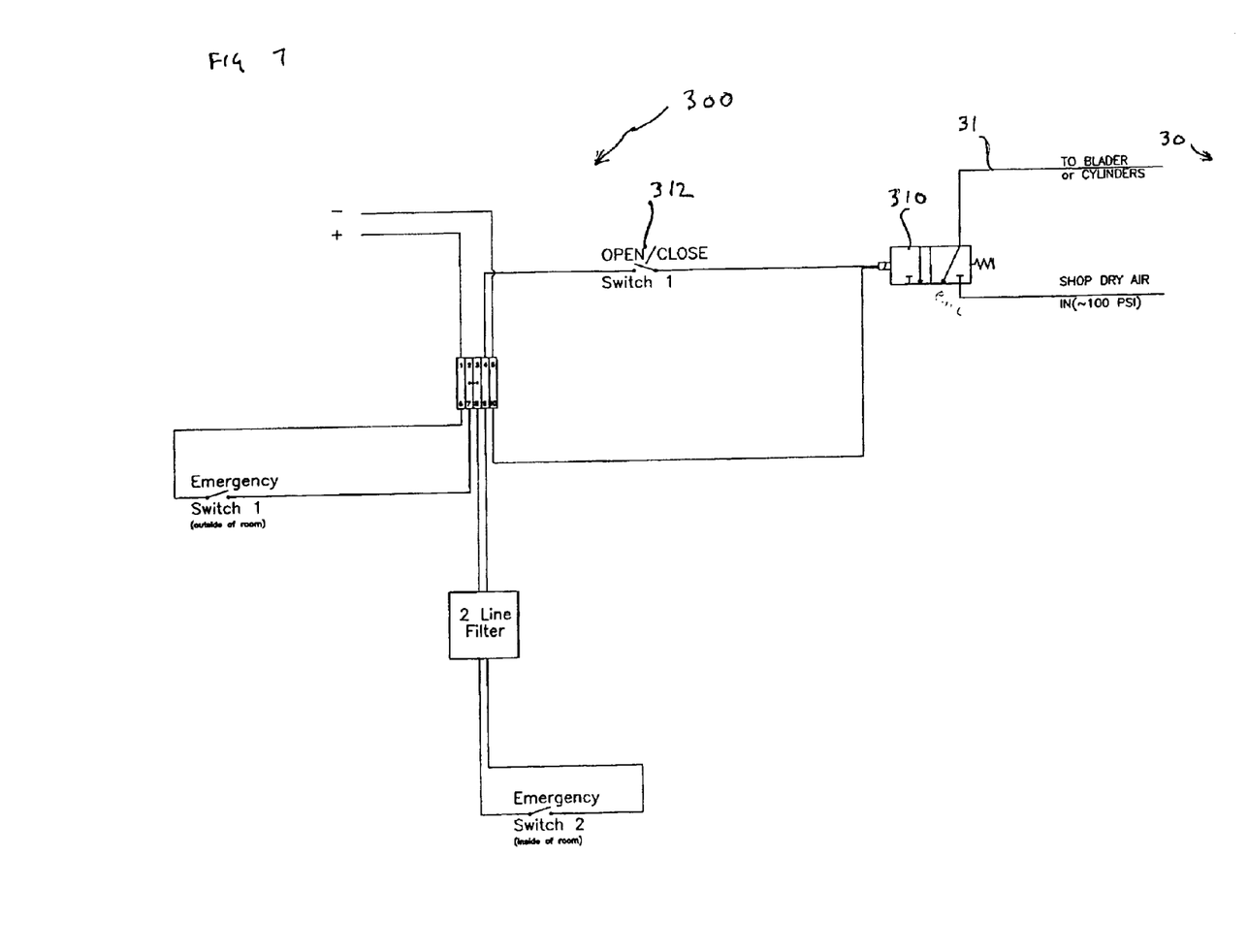
FIG. 7 is a electrical schematic diagram of the electrical contact actuation system, in accordance with features of the present invention.
Figure 8:
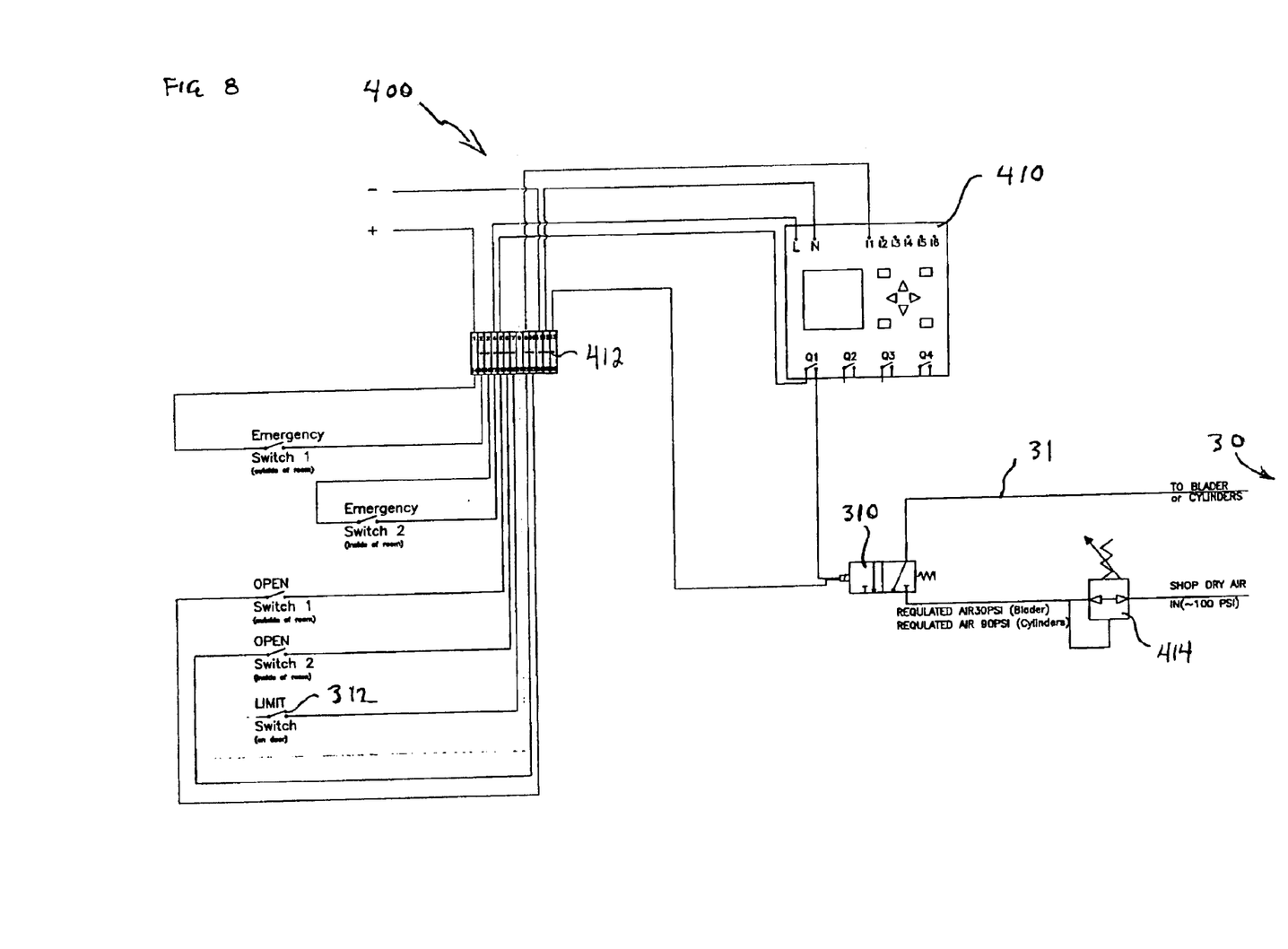
FIG. 8 is another electrical schematic of the electrical contact actuation system, in accordance with features of the present invention.

FIGS. 7 and 8 are electrical schematic diagrams, designated as numerals 300 and 400 respectively, of the piston actuation system utilized in the instant invention. The schematic depicts a bleeder valve 310 positioned remote from the piston location 10. This bleeder valve facilitates pressurized fluid control to and from the cylinders 30. A contact switch 312 actuates the contact-engagement mechanism so as such, the switch 312 represents the door handle. A myriad of typical filters, terminal blocks, pressure regulators 414, and back-up switches are situated within and outside the enclosure.

FIG. 8 depicts an electrical schematic whereby a controller box is situated within the mechanism configuration. This configuration, designated as numeral 400, confers complete self containment of the electrical control mechanism within the door/door-jamb package.

While the invention has been described with reference to details of the illustrated embodiment, these details are not intended to limit the scope of the invention as defined in the appended claims. For example, while the use of cylinders is specified herein to actuate electrical conductive webbing, bladders also can be utilized. In such instances, fluid pressure values of from 15 to 40 psi are suitable.

The embodiment of the invention in which an exclusive property or privilege is claimed is defined as follows:

1. A modular assembly for preventing electromagnetic radiation from leaking between a door leaf and a door jamb of a shielded room, the assembly comprising:
   a) an elongated frame adapted to be attached along a peripheral edge of the door leaf;
   b) an elongated, electrically conductive webbing in slidable communication with said frame;
   c) a means for extending the webbing from the edge; and
   d) a means for retracting the webbing to a position which is in close spatial relation to the frame.

2. The modular assembly as recited in claim 1 wherein the means for extending the webbing from the edge is positioned intermediate the frame and the webbing.

3. The modular assembly as recited in claim 1 wherein the extending means further comprises a rod extending substantially along a line defined by the edge, wherein the rod is actuated by a plurality of pistons which extend perpendicular to the line.

4. The modular assembly as recited in claim 1 wherein the rod is biased toward the frame.

5. The modular assembly as recited in claim 1 wherein the extending means further comprises a rod extending substantially along a line defined by the edge, wherein the rod is actuated by a plurality of bladders.

6. The modular assembly as recited in claim 5 wherein intermediate the rod and the webbing is reversibly deformable material.

7. The modular assembly as recited in claim 6 wherein the reversibly deformable material contacts a surface of the rod which opposes the webbing.

8. The modular assembly as recited in claim 1 wherein the webbing is extended in a direction parallel to the plane formed by the door leaf.

9. The modular assembly as recited in claim 1 wherein the extending means further comprises the use of a fluid ranging in pressure from 25 psi to 150 psi.

10. The modular assembly as recited in claim 1 wherein the extending means is activated upon the door leaf contacting the door jamb.

* * * * *